(12) United States Patent
Jibiki et al.

(10) Patent No.: US 12,527,096 B2
(45) Date of Patent: Jan. 13, 2026

(54) OPTICAL DETECTION DEVICE

(71) Applicant: Sony Semiconductor Solutions Corporation, Kanagawa (JP)

(72) Inventors: Yuma Jibiki, Tokyo (JP); Shohei Shimada, Tokyo (JP); Yusuke Otake, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 376 days.

(21) Appl. No.: 18/258,049

(22) PCT Filed: Jan. 5, 2022

(86) PCT No.: PCT/JP2022/000112
§ 371 (c)(1),
(2) Date: Jun. 16, 2023

(87) PCT Pub. No.: WO2022/158288
PCT Pub. Date: Jul. 28, 2022

(65) Prior Publication Data
US 2024/0072192 A1    Feb. 29, 2024

(30) Foreign Application Priority Data

Jan. 25, 2021   (JP) .................. 2021-009581

(51) Int. Cl.
*H10F 30/225*   (2025.01)
*H10F 39/00*    (2025.01)

(52) U.S. Cl.
CPC ......... *H10F 30/225* (2025.01); *H10F 39/805* (2025.01); *H10F 39/807* (2025.01); *H10F 39/811* (2025.01)

(58) Field of Classification Search
None
See application file for complete search history.

(56) References Cited

U.S. PATENT DOCUMENTS

| 10,204,950 B1 | 2/2019 | Yamashita |
| 2010/0059843 A1* | 3/2010 | Ikuta .................. H10F 39/026 257/E31.127 |

(Continued)

FOREIGN PATENT DOCUMENTS

| JP | 2019033136 A | 2/2019 |
| WO | 2018074530 A1 | 4/2018 |

(Continued)

OTHER PUBLICATIONS

International Search Report (PCT/ISA/210), International Application No. PCT/JP2022/000112, dated Apr. 5, 2022.

*Primary Examiner* — Nilufa Rahim
(74) *Attorney, Agent, or Firm* — Michael Best & Friedrich LLP

(57) ABSTRACT

Provided is an optical detection device capable of suppressing a fluctuation of a drive starting voltage in a pixel. The optical detection device includes: a semiconductor substrate that has a first surface as a light incident surface and a second surface on an opposite side to the light incident surface; a first pixel that is in the semiconductor substrate and has an avalanche amplification region including a first conductive region and a second conductive region; a pixel isolation portion that isolates the first pixel from an adjacent pixel; a first insulation film that is provided on the second surface side and in contact with the pixel isolation portion; and a second insulation film that is provided between the first insulation film and the avalanche amplification region, in which a film thickness of the second insulation film is larger than the film thickness of the first insulation film.

13 Claims, 16 Drawing Sheets

(56) References Cited

U.S. PATENT DOCUMENTS

2020/0091208 A1* 3/2020 Otake ................ H10F 39/8057
2020/0105812 A1* 4/2020 Sze .................... H10F 39/1843

FOREIGN PATENT DOCUMENTS

| WO | 2020184213 A1 | 9/2020 |
| WO | 2020203222 A1 | 10/2020 |

* cited by examiner

OPTICAL DETECTION DEVICE

TECHNICAL FIELD

The present disclosure relates to an optical detection device.

BACKGROUND ART

An avalanche photodiode (APD) includes a Geiger mode in which the APD is operated at a bias voltage higher than a breakdown voltage and a linear mode in which the APD is operated at a slightly higher bias voltage near the breakdown voltage. The Geiger mode avalanche photodiode is also referred to as a single photon avalanche photodiode (SPAD). The SPAD detects one photon for each pixel by multiplying a carrier generated by photoelectric conversion in a PN junction region of a high electric field provided for each pixel.

CITATION LIST

Patent Document

Patent Document 1: WO 2018-074530 A

SUMMARY OF THE INVENTION

Problems to be Solved by the Invention

In such a SPAD, a deep element isolation portion may be provided in a semiconductor substrate in order to isolate pixels from each other. When the element isolation portion is formed, a stopper film (for example, a silicon nitride film) is required, but there has been a possibility that the stopper film traps a charge during driving of the SPAD and changes a drive start voltage in the pixel.

Therefore, the present disclosure provides an optical detection device capable of suppressing a fluctuation of a drive starting voltage in a pixel.

Solutions to Problems

According to an aspect of the present disclosure, there is provided an optical detection device including: a semiconductor substrate that has a first surface as a light incident surface and a second surface on an opposite side to the light incident surface; a first pixel that is in the semiconductor substrate and has an avalanche amplification region including a first conductive region and a second conductive region; a pixel isolation portion that isolates the first pixel from an adjacent pixel; a first insulation film that is provided on the second surface side and in contact with the pixel isolation portion; and a second insulation film that is provided between the first insulation film and the avalanche amplification region, in which a film thickness of the second insulation film is larger than the film thickness of the first insulation film.

The first insulation film is a silicon nitride film, and the second insulation film is a silicon oxide film.

The first insulation film has a thickness of less than 15 nm, and the second insulation film has the thickness of 40 nm or less.

The first insulation film is in contact with an end portion of the pixel isolation portion on the second surface side.

The optical detection device further includes a third insulation film that is provided between the first insulation film and the second insulation film and has a higher surface density as compared with the first and second insulation films.

The third insulation film includes aluminum oxide.

The first insulation film is provided below the avalanche amplification region.

The first insulation film is provided only immediately below an end portion of the pixel isolation portion on the second surface side.

The optical detection device further includes a first contact plug that penetrates the first and second insulation films and is electrically connected to one end of the avalanche amplification region.

The optical detection device further includes: a charge accumulation region that is provided around the avalanche amplification region; and a second contact plug that penetrates the first and second insulation films and is electrically connected to one end of the charge accumulation region.

One of the first and second contact plugs functions as a cathode and the other one functions as an anode.

The optical detection device further includes: a first contact diffusion layer that electrically connects the first contact plug to one end of the avalanche amplification region; and a second contact diffusion layer that electrically connects the second contact plug to one end of the charge accumulation region, in which the first contact diffusion layer is wider than the avalanche amplification region in a plan view as viewed in a direction substantially perpendicular to the first surface.

The optical detection device further includes: a first contact diffusion layer that electrically connects the first contact plug to one end of the avalanche amplification region; and a second contact diffusion layer that electrically connects the second contact plug to one end of the charge accumulation region, in which the second contact diffusion layer is wider than an end surface of one end of the charge accumulation region in a plan view as viewed in a direction substantially perpendicular to the first surface.

According to another aspect of the present disclosure, there is provided an optical detection device including: a semiconductor substrate that has a first surface as a light incident surface and a second surface on an opposite side to the light incident surface; a first pixel that is in the semiconductor substrate and has an avalanche amplification region including a first conductive region and a second conductive region; a pixel isolation portion that isolates the first pixel from an adjacent pixel; and a silicon oxide film that is in contact with an end portion of the pixel isolation portion on the second surface side.

The optical detection device further includes a first contact plug that penetrates the silicon oxide film and is electrically connected to one end of the avalanche amplification region.

The optical detection device further includes: a charge accumulation region that is provided around the avalanche amplification region; and a second contact plug that penetrates the silicon oxide film and is electrically connected to one end of the charge accumulation region.

One of the first and second contact plugs functions as a cathode and the other one functions as an anode.

MODE FOR CARRYING OUT THE INVENTION

Figure 1:
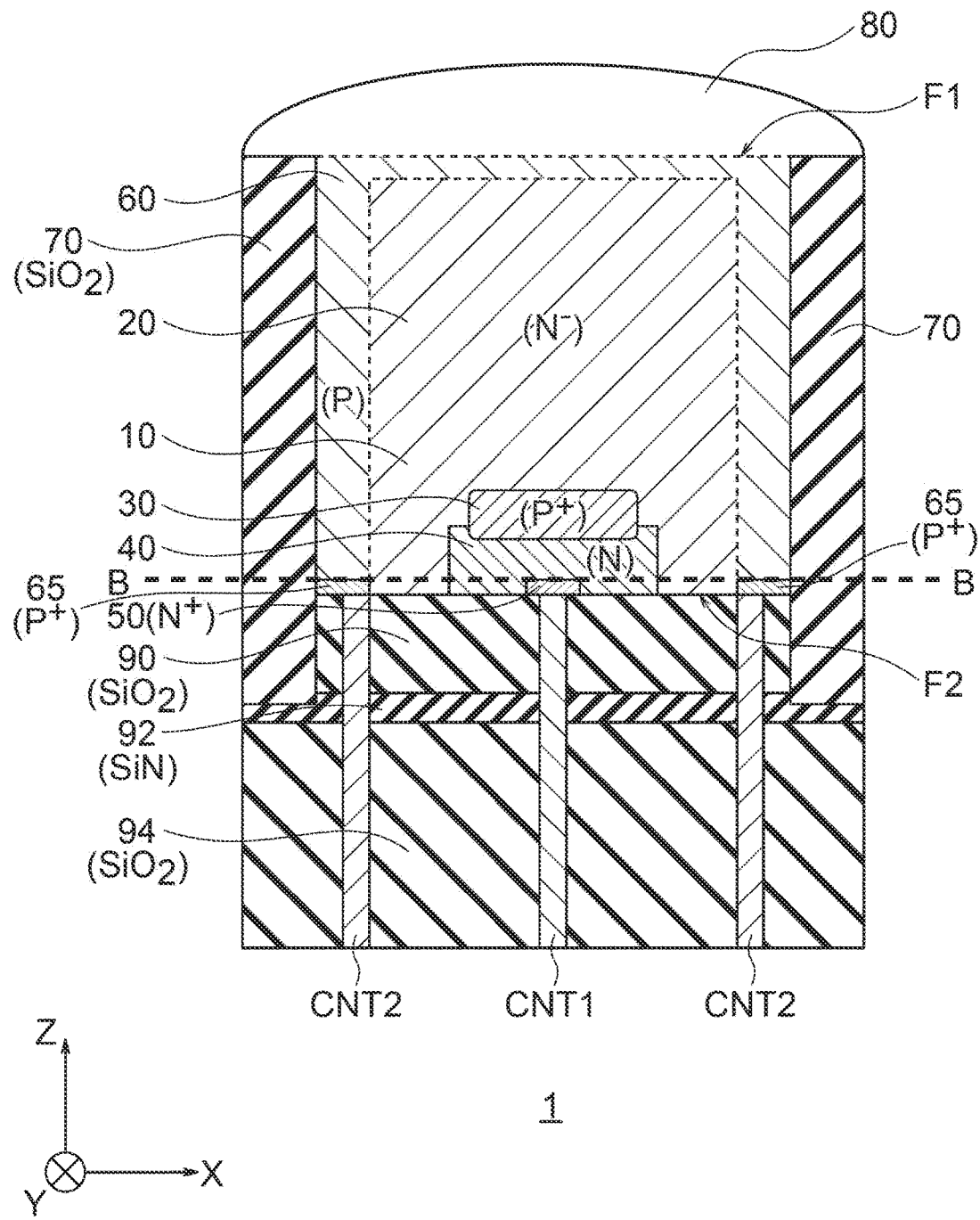
FIG. 1 is a cross-sectional view illustrating a configuration example of a back-side illumination SAPD according to a first embodiment.

Hereinafter, specific embodiments to which the present technology is applied will be described in detail with reference to the drawings. The drawings are schematic or conceptual, and the ratio of each portion are not necessarily the same as actual ones. In the description and the drawings, elements similar to those described above with respect to previously described drawings are denoted by the same reference numerals, and detailed descriptions thereof will be appropriately omitted. The present technology may be applied to an optical detector. Furthermore, an APD will be described as an example of the optical detector.

The SPAD can detect one photon for each pixel by multiplying a carrier generated by photoelectric conversion in a PN junction region of a high electric field provided for each pixel. The present technology can obtain higher effects by being applied to the SPAD among the APDs.

First Embodiment

FIG. 1 is a cross-sectional view illustrating a configuration example of a back-side illumination SAPD according to the first embodiment. A pixel 1 includes a substrate 10, an element isolation portion 70, an on-chip lens 80, insulation films 90, 92, and 94, and contact plugs CNT1 and CNT2.

The substrate 10 is, for example, a silicon substrate, and has a first surface F1 that is a light incident surface and a second surface F2 on an opposite side to the first surface F1. The substrate 10 has a well diffusion layer 20 introduced from the second surface F2. The well diffusion layer 20 may be an N-type semiconductor region or a P-type semiconductor region. Furthermore, for example, the well diffusion layer 20 is preferably an N type or P type semiconductor region having a low concentration of $1 \times 10^{14}$ atoms/cm$^3$ or less. Therefore, the well diffusion layer 20 can be easily depleted, and photon detection efficiency (PDE) can be improved.

The well diffusion layer 20 in the surface region of the second surface F2 is provided with an N-type impurity diffusion layer 40 functioning as a cathode. Furthermore, in the well diffusion layer 20, a P$^+$ type impurity diffusion layer 30 is provided adjacent to the diffusion layer 40. The diffusion layer 40 is, for example, an N-type semiconductor region having an impurity concentration higher than that of the well diffusion layer 20. The diffusion layer 30 is a P$^+$ type semiconductor region having an impurity concentration higher than those of the well diffusion layer 20 and the diffusion layer 40. The diffusion layer 30 and the diffusion layer 40 constitute a PN junction portion at a junction interface. The diffusion layers 30 and 40 function as an amplification region in which carriers generated by incidence of light to be detected are subjected to avalanche amplification. The diffusion layer 40 is preferably depleted, and thus the PDE can be improved. Hereinafter, the diffusion layers 30 and 40 are also referred to as an avalanche amplification region. Note that the diffusion layers 30 and 40 are an example of a first conductive region and an example of a second conductive region, respectively.

The diffusion layer 40 is provided with an N$^+$ type contact diffusion layer 50 having a high impurity concentration. The contact diffusion layer 50 as a first contact diffusion layer is connected to the diffusion layer 40 and is connected to a control circuit (complementary metal oxide semiconductor (CMOS) circuit) (not illustrated) via the contact plug CNT1.

A hole accumulation region 60 as a charge accumulation region is provided in the substrate 10 between the well diffusion layer 20 and the element isolation portion 70. That is, the hole accumulation region 60 is provided around the avalanche amplification region (30, 40), and is provided on opposite sides of the well diffusion layer 20 to be separated from the diffusion layers 30 and 40. Moreover, the hole accumulation region 60 is also provided between the well diffusion layer 20 and the on-chip lens 80. That is, the hole accumulation region 60 is also provided on the first surface F1 side of the well diffusion layer 20. The hole accumulation region 60 is provided in a portion where different materials are in contact. For example, the hole accumulation region 60 is provided at an interface between the substrate 10 (for example, silicon) and the element isolation portion 70 (for example, a metal material such as tungsten) or at an interface between the substrate 10 and the on-chip lens 80 (for example, resin). The hole accumulation region 60 is provided to suppress a dark current generated at these interfaces. Note that the element isolation portion 70 is an example of a pixel isolation portion that isolates adjacent pixels 1.

By providing the hole accumulation region 60 and the element isolation portion 70, electrical and optical crosstalk between the pixels 1 can be suppressed.

Furthermore, by providing the hole accumulation region 60 on opposite side surfaces of the well diffusion layer 20, an electric field in a lateral direction (X direction or a Y direction) is formed on the opposite side surfaces of the well diffusion layer 20, and charges are easily collected in a high electric field region. This leads to an improvement in PDE. Furthermore, by using the metal material such as tungsten having a high a light shielding property for the element isolation portion 70, incident light can be reflected to the well diffusion layer 20 to further improve the PDE, and the crosstalk between adjacent pixels 1 can be suppressed.

The hole accumulation region 60 can be formed by ion implantation, solid-phase diffusion, induction caused by a fixed charge film, or the like.

By providing the hole accumulation region 60 at the interface between the well diffusion layer 20 and the element isolation portion 70, the hole accumulation region 60 can trap electrons generated at the interface and can suppress a dark current component (that is, a dark count rate (DCR)). Here, the hole accumulation region 60 accumulates holes to trap electrons. However, by inverting the conductivity type of each diffusion layer in the pixel 1, the accumulation region 60 may accumulate electrons to trap holes.

Note that in a case where the dark current component is sufficiently small, the hole accumulation region 60 may be provided only on opposite side surfaces of the well diffusion layer 20. In this case, the hole accumulation region 60 of the first surface F1 may be omitted. Furthermore, the hole accumulation region 60 can be formed by ion implantation, solid-phase diffusion, induction caused by a fixed charge film, or the like.

The element isolation portion 70 is provided so as to surround the periphery of the well diffusion layer 20 of each pixel 1, and is provided to electrically and optically isolate adjacent pixels 1 from each other. For example, in a plan view as viewed in a direction substantially perpendicular to the first surface F1 (Z direction), the element isolation portions 70 are provided to form a lattice shape so as to surround the periphery of the avalanche amplification region of each pixel 1. Furthermore, the element isolation portion 70 penetrates from the first surface F1 to the second surface F2 of the substrate 10 in a cross section taken in a direction (Z direction) substantially perpendicular to the first surface F1. That is, the element isolation portion 70 is provided between the adjacent pixels 1, and the avalanche amplification region (30, 40) correspond to each of the pixels 1 on a one-to-one basis. Therefore, the element isolation portion 70 can electrically and optically isolate the pixel 1 from each other. Note that the element isolation portion 70 may be configured to be inserted to the midway of the substrate 10.

The on-chip lens 80 is provided on the first surface F1 of the substrate 10. For the on-chip lens 80, for example, a transparent resin is used. In the present embodiment, light is incident from the first surface (back surface) F1 on the opposite side to the second surface F2 on which the contact plugs CNT1 to CNT3 and the control circuit are provided. Therefore, the pixel 1 is a back-side illumination SAPD. In the case of the back-side illumination pixel, the control circuit (not illustrated) may be stacked on the second surface (front surface) F2 side of the substrate 10 as a separate substrate. Furthermore, the control circuit may be disposed in a region outside the pixel area of the second surface F2 in the same substrate 10.

A $P^+$ type contact diffusion layer 65 having a high impurity concentration is provided on the second surface F2 side of the hole accumulation region 60. The contact diffusion layer 65 as a second contact diffusion layer is connected to the hole accumulation region 60 and is connected to the control circuit via the contact plug CNT2. The contact diffusion layer 65 functions as an anode.

On the second surface F2 of the substrate 10, the insulation films 90, 92, and 94 are stacked in this order. The insulation film 92 as a first insulation film is provided between the insulation film 90 and the insulation film 94, and functions as a stopper when the element isolation portion 70 is formed from the first surface F1 side. Therefore, the insulation film 92 is in contact with the element isolation portion 70 at an end portion of the element isolation portion 70 on the second surface F2 side. As the insulation film 92, for example, an insulation film such as a silicon nitride film, yttrium oxide ($Y_2O_3$), lanthanum oxide ($La_2O_3$), aluminum oxide ($Al_2O_3$), or hafnium oxide ($HfO_2$) is used.

The insulation film 90 as a second insulation film is provided between the insulation film 92 and the diffusion layer 40. That is, the insulation film 90 is provided between the insulation film 92 and the avalanche amplification region (30, 40). For the insulation film 90, for example, a silicon oxide film is used.

The insulation film 94 is provided so as to be in contact with the insulation film 92. For the insulation film 94, for example, the same silicon oxide film as the insulation film 90 is used.

Here, the film thickness of the insulation film 90 is larger than the film thickness of the insulation film 92. The insulation film 92 is provided as an etching stopper when the element isolation portion 70 is formed. For example, when a trench used for the element isolation portion 70 is formed in the substrate 10, the substrate 10 is etched from the first surface F1 to the second surface F2, and the insulation film 90 is also etched. At this time, the insulation film 90 is, for example, a silicon oxide film, and in a case where the insulation film 92 is a silicon nitride film, etching can be stopped by the silicon nitride film according to a selection ratio. As described above, the insulation film 92 functions as an etching stopper when the element isolation portion 70 is formed. Therefore, the film thickness of the insulation film 92 is formed to have a thickness (for example, 40 nm) capable of functioning as an etching stopper.

On the other hand, the element isolation portion 70 is only required to be provided from the first surface F1 to the second surface F2 of the substrate 10 in order to electrically and optically isolate the pixel 1. Therefore, the insulation film 92 is only required to be provided in the vicinity of the second surface F2, and the film thickness of the insulation film 90 is preferably thin in order to shorten the etching step.

However, in a case where the film thickness of the insulation film 90 is thin, charges generated in the avalanche amplification region (30, 40) and the well diffusion layer 20 are trapped on the insulation film 92 via the insulation film 90. In this case, the insulation film 92 is charged up, and an electric field is applied to the avalanche amplification region (30, 40). When the electric field is applied to the avalanche amplification region (30, 40), the drive start voltage (threshold voltage) of the pixel 1 fluctuates. In this case, even when a predetermined drive voltage is applied to the contact plugs CNT1 and CNT2, the pixel 1 does not operate as expected.

On the other hand, in the pixel 1 according to the present disclosure, the film thickness of the insulation film 90 is larger than the film thickness of the insulation film 92. Therefore, the thick insulation film (for example, a silicon oxide film) 90 is interposed between the avalanche amplification region (30, 40) and the insulation film (for example, a silicon nitride film) 92, and a distance from the avalanche amplification region (30, 40) to the insulation film 92 can be increased. Accordingly, the charges generated in the avalanche amplification region (30, 40) and the well diffusion layer 20 are less likely to reach the insulation film 92, and less likely to be trapped on the insulation film 92. Furthermore, even when the charges are trapped on the insulation film 92, the electric field due to this is less likely to influence the avalanche amplification region (30, 40). As a result, it is possible to suppress the fluctuation of the drive start voltage (threshold voltage) in the pixel 1.

In a case where the insulation film 90 is a silicon oxide film, the film thickness of the insulation film 90 is, for example, equal to or greater than 15 nm, and preferably equal to or greater than 30 nm. In a case where the insulation film 92 is a silicon nitride film, the film thickness of the insulation film 92 is, for example, equal to or less than 40 nm.

The contact plug CNT1 penetrates the insulation films 90, 92, and 94 and is electrically connected to the contact diffusion layer 50 as one end (cathode) of the avalanche amplification region. The contact plug CNT2 penetrates the insulation films 90, 92, and 94, is connected to the contact diffusion layer 65 as an anode, and is electrically connected to one end of the hole accumulation region 60 via the contact diffusion layer 65. By applying a voltage to the contact plugs CNT1 and CNT2, a depletion layer can be expanded from the diffusion layer 40 to the well diffusion layer 20.

Figure 2:
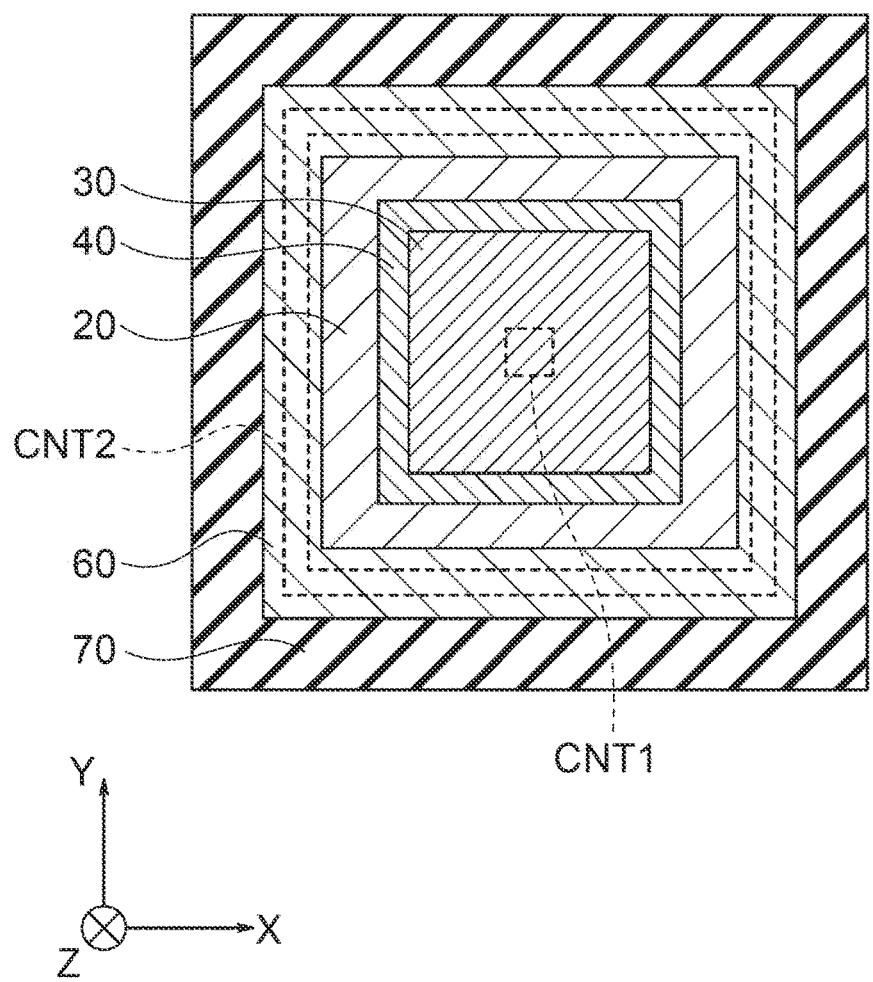
FIG. 2 is a schematic plan view illustrating a configuration example of a pixel.

FIG. 2 is a schematic plan view illustrating a configuration example of the pixel 1. FIG. 2 illustrates a plane taken along line B-B in FIG. 1. The pixel 1 has a substantially square shape or a substantially rectangular shape in a plan view in the Z direction. The outer periphery of the pixel 1 is surrounded by the element isolation portion 70. The hole accumulation region 60, the well diffusion layer 20, the diffusion layer 40, and the diffusion layer 30 are disposed in this order inside the element isolation portion 70.

The contact plug CNT1 is connected to the contact diffusion layer 50 (not illustrated in FIG. 2) and the center portion of the diffusion layer 40. The contact plug CNT2 is provided on the entire inner periphery of the element isolation portion 70 along the hole accumulation region 60. In the present disclosure, for example, the pixel 1 has a square shape. In this case, it is possible to secure the wide area of the avalanche amplification region (30, 40). Therefore, the PDE can be improved.

On the other hand, the pixel 1 may have a circular shape, an elliptical shape, or another polygonal shape. For example, in a case where the avalanche amplification region (30, 40) is circular, it is possible to suppress electric field concentration at the end portion of the avalanche amplification region (30, 40), and it is possible to suppress unintended edge breakdown.

As described above, the pixel 1 according to the first embodiment includes the insulation film 90 thicker than the insulation film 92. Accordingly, the charges generated in the avalanche amplification region (30, 40) and the well diffusion layer 20 are less likely to reach the insulation film 92, and less likely to be trapped on the insulation film 92. Furthermore, the charge of the insulation film 92 is less likely to influence the avalanche amplification region (30, 40). As a result, it is possible to suppress the fluctuation of the drive start voltage (threshold voltage) in the pixel 1.

Furthermore, the insulation film 92 covers the entire surface of the pixel 1 on the second surface F2 side except the region through which the contact plugs CNT1 and CNT2 pass. In a case where the insulation film 92 is a silicon nitride film, the insulation film 92 can prevent hydrogen from entering the pixel 1 from the outside. As a result, the pixel 1 can be prevented from being deteriorated by the hydrogen.

Second Embodiment

Figure 3:
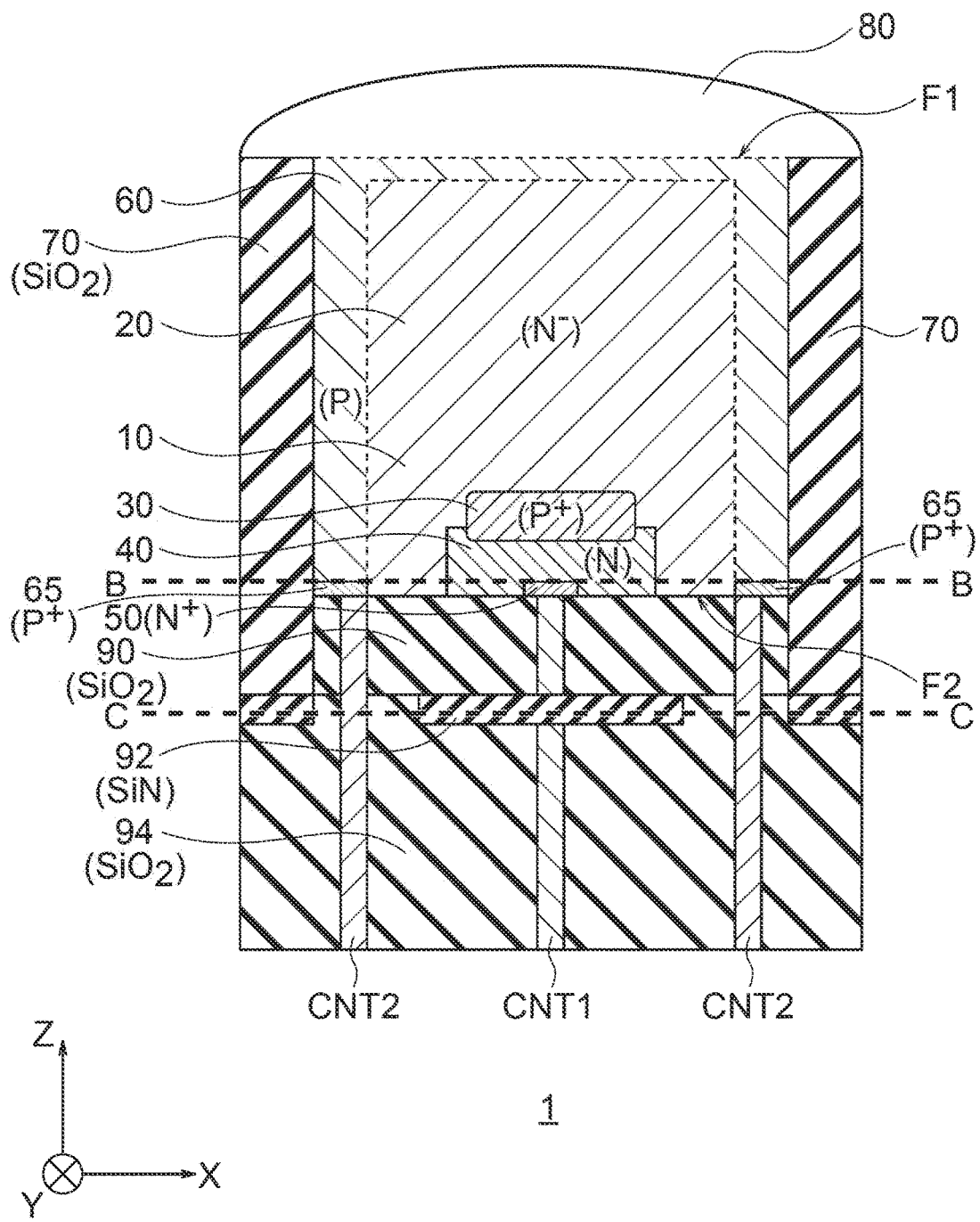
FIG. 3 is a cross-sectional view illustrating a configuration example of a pixel according to a second embodiment.
Figure 4:
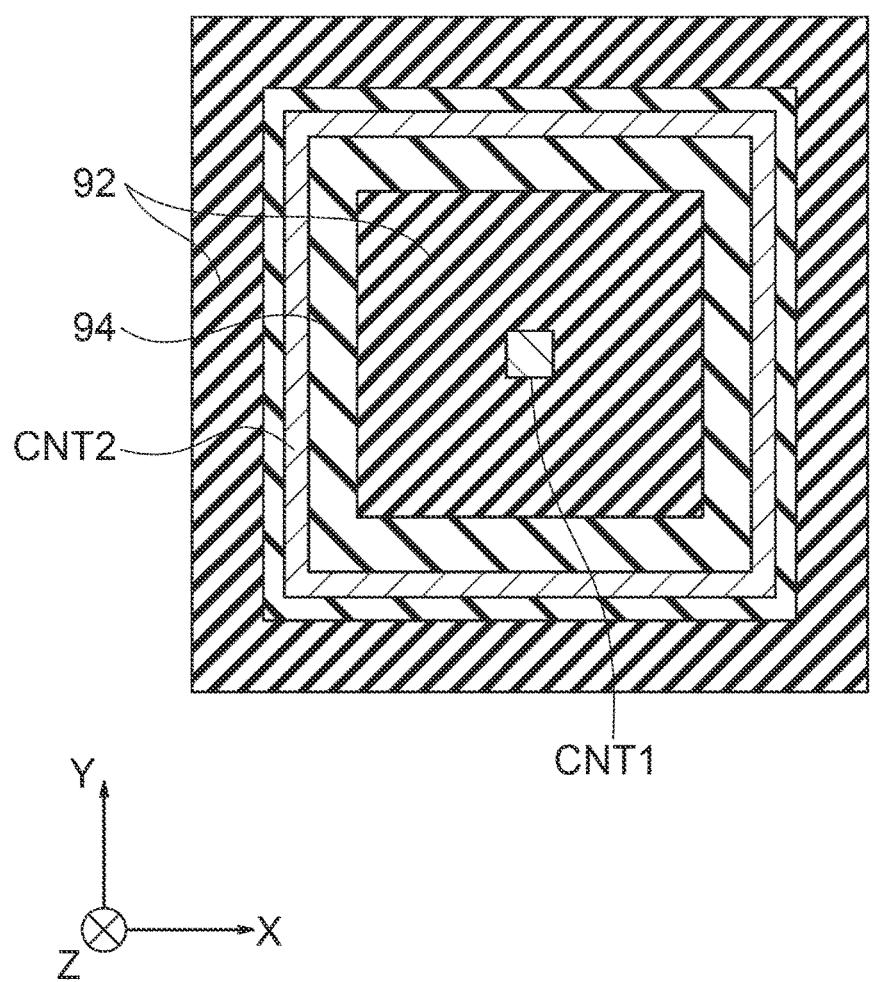
FIG. 4 is a schematic plan view illustrating a configuration example of a pixel according to the second embodiment.

FIG. 3 is a cross-sectional view illustrating a configuration example of a pixel 1 according to the second embodiment. FIG. 4 is a schematic plan view illustrating a configuration example of the pixel 1 according to the second embodiment. FIG. 4 illustrates a plane taken along line C-C in FIG. 3. Note that a cross section taken along line B-B in FIG. 4 may be the same as that in FIG. 2.

According to the second embodiment, the insulation film 92 is provided immediately below the end portion of the element isolation portion 70 on the second surface F2 side, and is also provided below the avalanche amplification region (30, 40). On the other hand, the insulation film 92 is not provided on the entire surface of the pixel 1. The insulation film 92 is not provided around the contact plug CNT2, that is, below the end portion (contact diffusion layer 65) of the hole accumulation region 60 on the second surface F2 (guard ring region). Therefore, as illustrated in FIG. 4, the insulation film 92 is partially provided, and is not provided in the entire pixel 1. The other configurations of the second embodiment may be similar to the corresponding configurations of the first embodiment.

According to the second embodiment, since the insulation film 92 is partially omitted, the charges generated in the avalanche amplification region (30, 40) and the well diffusion layer 20 are less likely to be further trapped on the insulation film 92. Accordingly, the charge of the insulation film 92 is less likely to influence the avalanche amplification region (30, 40). As a result, it is possible to further suppress the fluctuation of the drive start voltage (threshold voltage) in the pixel 1.

On the other hand, since the insulation film 92 is provided immediately below the end portion of the element isolation portion 70 on the second surface F2 side, it can function as an etching stopper in a step of forming the element isolation portion 70. Furthermore, the insulation film 92 is provided below the avalanche amplification region (30, 40). Therefore, the insulation film 92 can prevent hydrogen from entering the pixel 1 from the outside to some extent.

The formation region of the insulation film 92 is only required to be determined in consideration of the fluctuation of the drive start voltage of the pixel 1 and the deterioration of the pixel 1 caused by the hydrogen. The second embodiment can further obtain other effects of the first embodiment.

Third Embodiment

Figure 5:
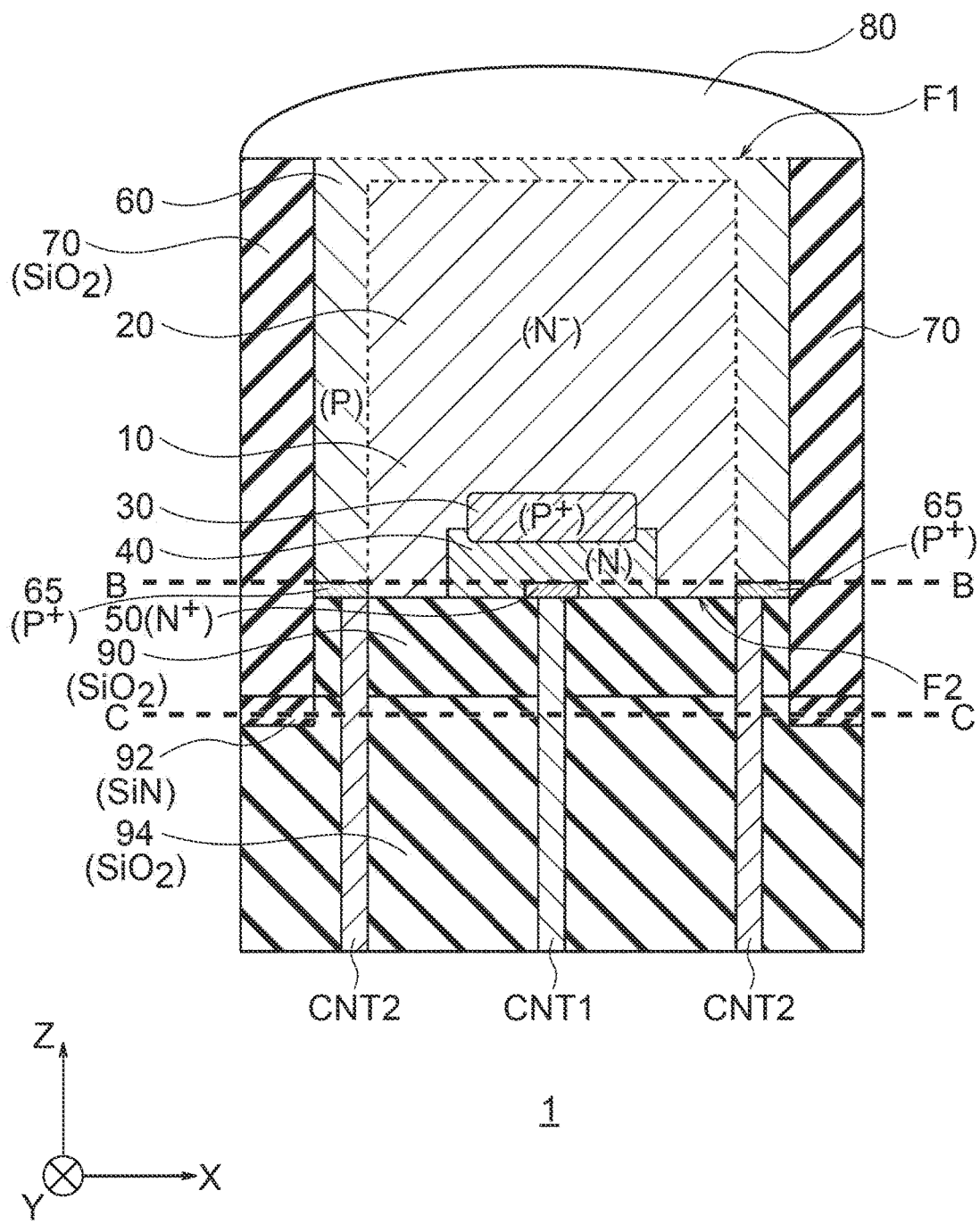
FIG. 5 is a cross-sectional view illustrating a configuration example of a pixel according to a third embodiment.
Figure 6:
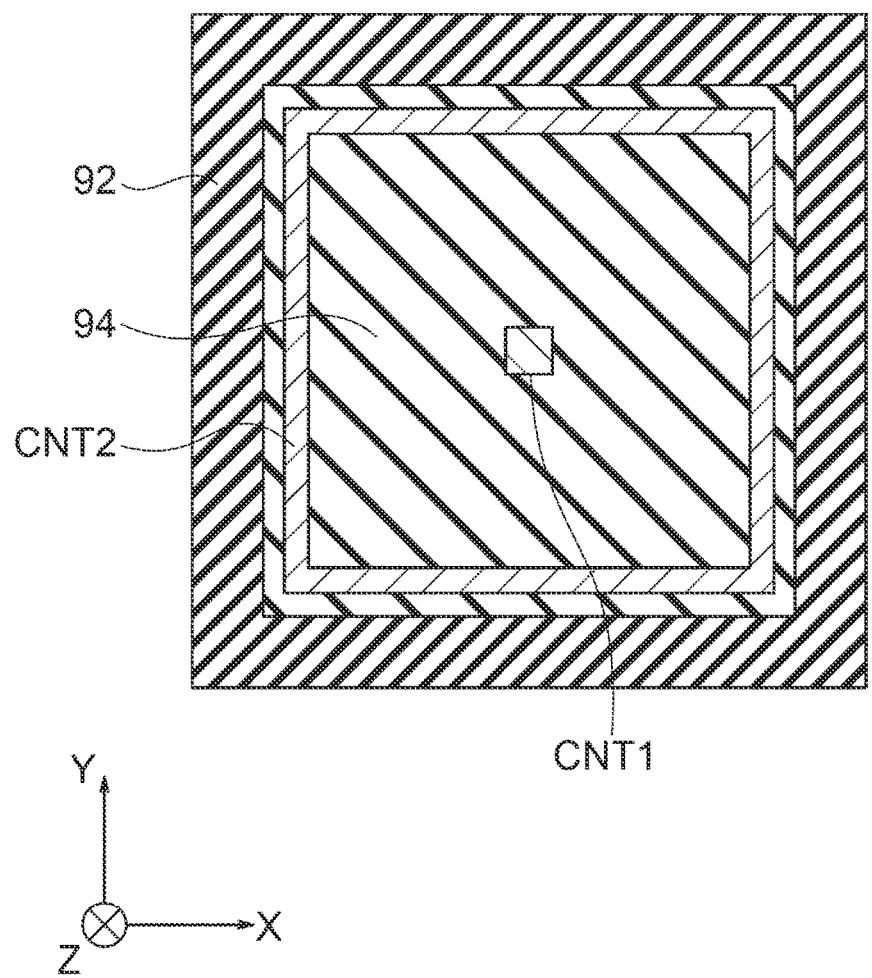
FIG. 6 is a schematic plan view illustrating a configuration example of a pixel according to the third embodiment.

FIG. 5 is a cross-sectional view illustrating a configuration example of a pixel 1 according to the third embodiment. FIG. 6 is a schematic plan view illustrating a configuration example of the pixel 1 according to the third embodiment. FIG. 6 illustrates a plane taken along line C-C in FIG. 5. Note that a cross section taken along line B-B in FIG. 5 may be the same as that in FIG. 2.

According to the third embodiment, the insulation film 92 is provided only immediately below the end portion of the element isolation portion 70 on the second surface F2 side. On the other hand, the insulation film 92 is not provided on the entire surface of the pixel 1. The insulation film 92 is not provided around the contact plug CNT1 and the contact plug CNT2, that is, below the end portion (contact diffusion layer 65) of the hole accumulation region 60 on the second surface F2 and the avalanche amplification region (30, 40). Therefore, as illustrated in FIG. 6, the insulation film 92 is partially provided, and is not provided in the entire pixel 1. The other configurations of the third embodiment may be similar to the corresponding configurations of the first embodiment.

According to the third embodiment, since the insulation film 92 is omitted further than the second embodiment, the charges generated in the avalanche amplification region (30, 40) and the well diffusion layer 20 are less likely to be further trapped on the insulation film 92. Accordingly, the charge of the insulation film 92 is less likely to influence the avalanche amplification region (30, 40). As a result, it is possible to further suppress the fluctuation of the drive start voltage (threshold voltage) in the pixel 1.

On the other hand, since the insulation film 92 is provided immediately below the end portion of the element isolation portion 70 on the second surface F2 side, it can function as an etching stopper in a step of forming the element isolation portion 70.

Fourth Embodiment

Figure 7:
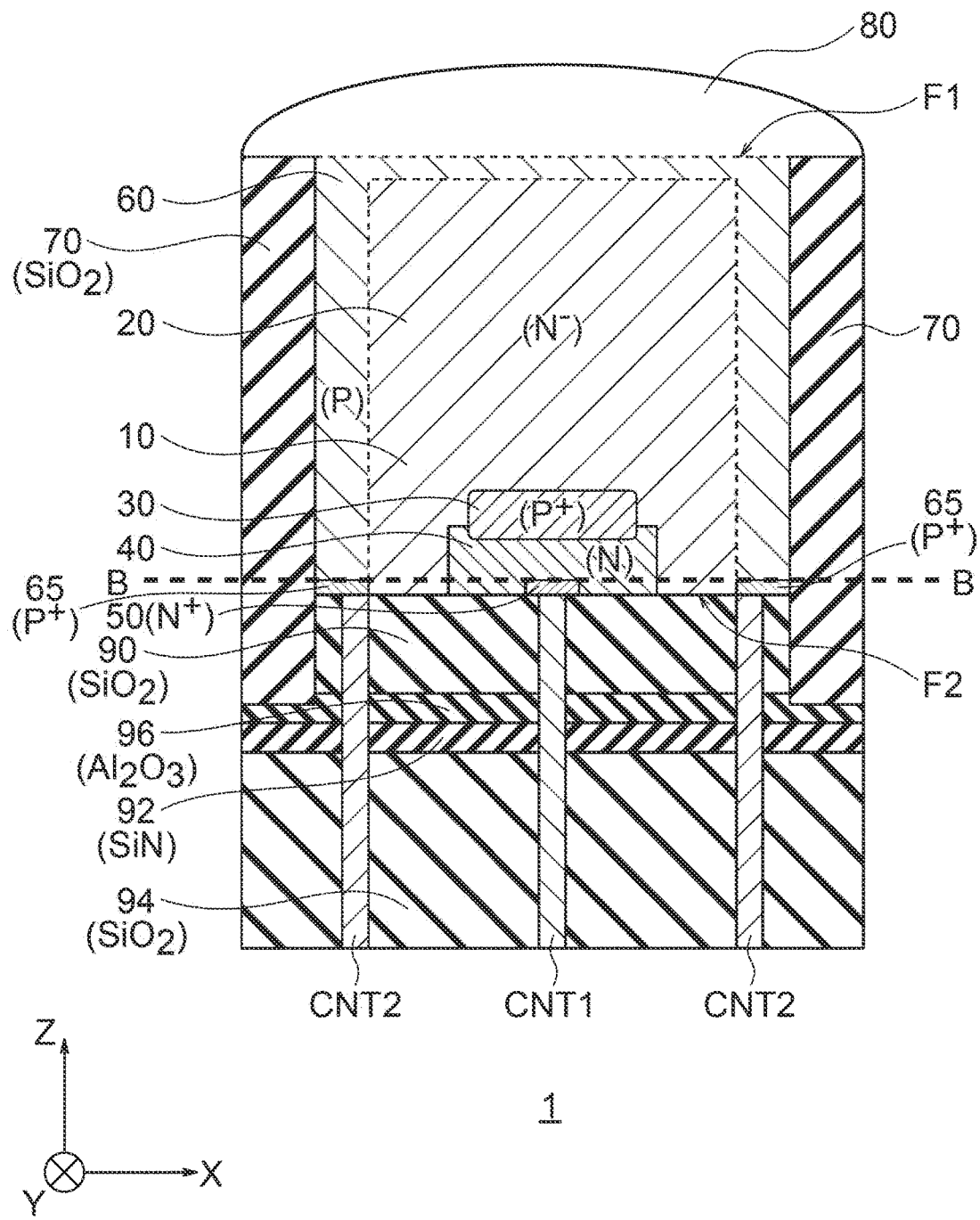
FIG. 7 is a cross-sectional view illustrating a configuration example of a pixel according to a fourth embodiment.

FIG. 7 is a cross-sectional view illustrating a configuration example of a pixel 1 according to the fourth embodiment. Note that a cross section taken along line B-B in FIG. 7 may be the same as that in FIG. 2.

According to the fourth embodiment, an insulation film 96 is provided between the insulation film 92 and the insulation film 90. For example, in a case where the insulation film 90 is a silicon oxide film and the insulation film 92 is a silicon nitride film, a band gap of the silicon oxide film is about 8.8 eV, whereas a band gap of the silicon nitride film is about 5.1 eV. Therefore, a large energy gap is generated at the interface between the insulation film 90 and the insulation film 92. In this case, a charge (for example, an electron) from the avalanche amplification region (30, 40) is likely to be accumulated on the insulation film 92 which is the silicon nitride film. Therefore, the insulation film 96 that is less likely to be charged up is provided between the insulation film 90 and the insulation film 92. For the insulation film 96 as a third insulation film, a material having a band gap closer to that of the silicon oxide film is only required to be used as compared with the insulation film 90. Furthermore, the insulation film 96 is preferably an oxide film having a higher surface density than the insulation film 92. In a case where the insulation film 90 is a silicon oxide film and the insulation film 92 is a silicon nitride film, for example, an insulation film such as aluminum oxide ($Al_2O_3$) is preferably used for the insulation film 96.

The insulation film 96 can suppress the influence of the charge (negative charge) accumulated on the insulation film 92 by pinning the fixed charge (positive charge). The insulation film 96 functions as an etching stopper in a step of forming the element isolation portion 70.

The other configurations of the fourth embodiment may be similar to the corresponding configurations of the first embodiment. Therefore, the fourth embodiment can obtain the effects similar to those of the first embodiment.

In the fourth embodiment, the insulation film 96 is provided together with the insulation film 92. However, the insulation film 96 may be provided instead of the insulation film 92.

Fifth Embodiment

Figure 8:
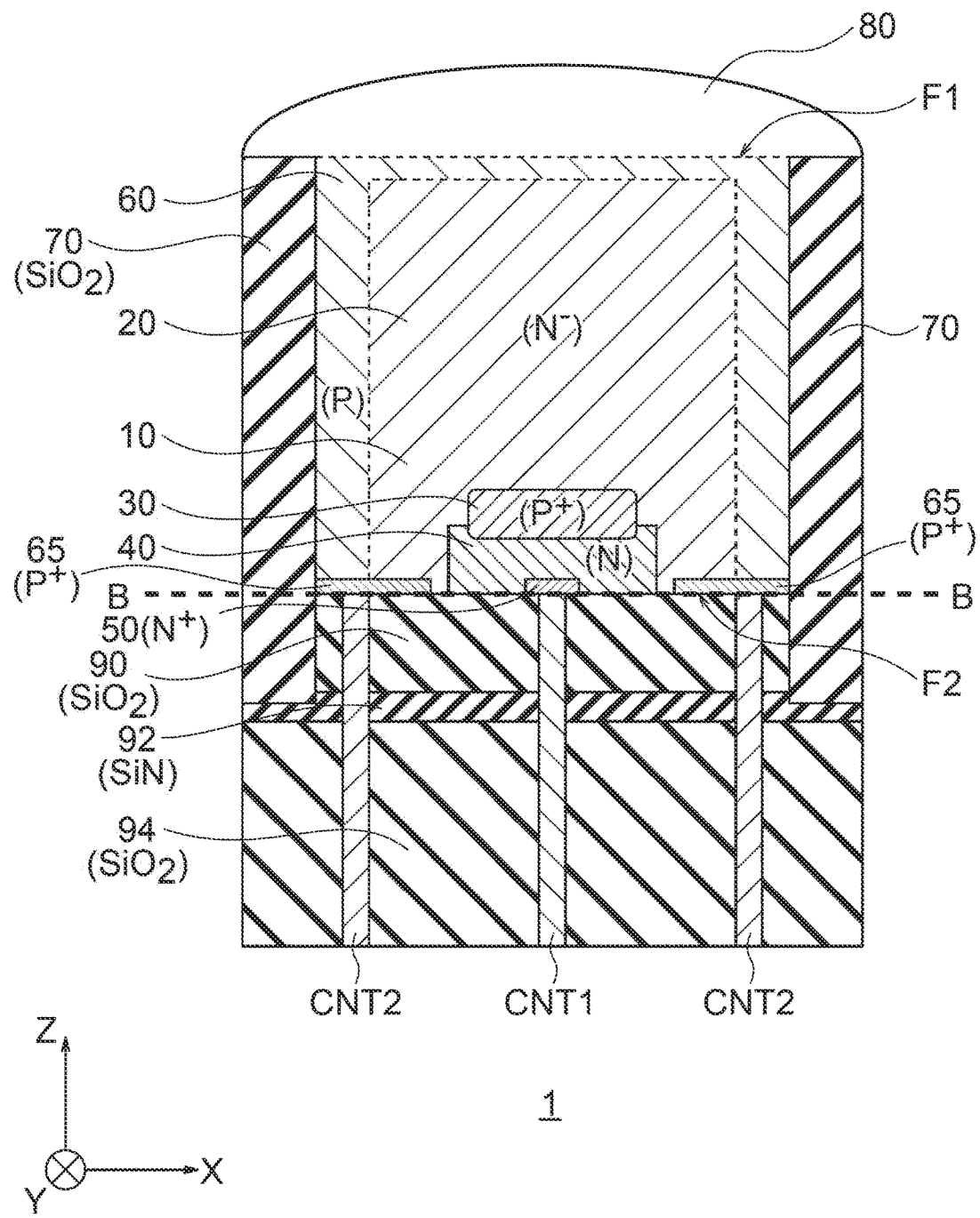
FIG. 8 is a cross-sectional view illustrating a configuration example of a pixel according to a fifth embodiment.
Figure 9:
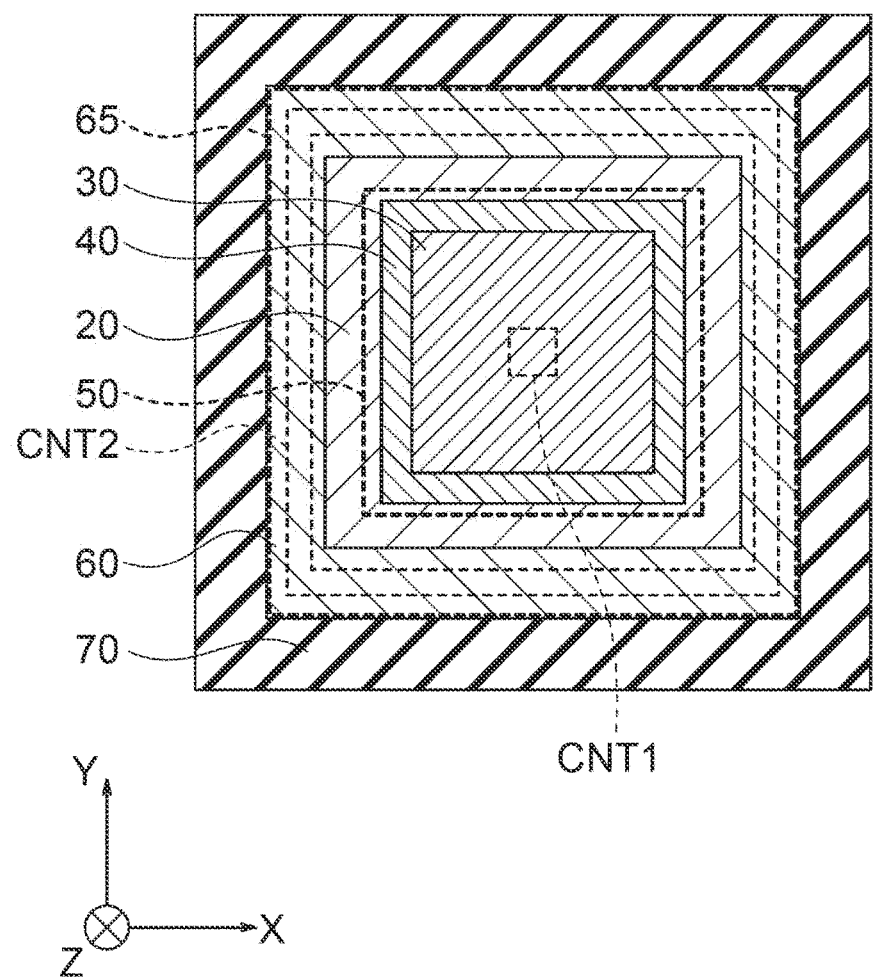
FIG. 9 is a schematic plan view illustrating a configuration example of a pixel according to the fifth embodiment.

FIG. 8 is a cross-sectional view illustrating a configuration example of a pixel 1 according to the fifth embodiment. FIG. 9 is a schematic plan view illustrating a configuration example of the pixel 1 according to the fifth embodiment. FIG. 9 illustrates a plane taken along line B-B in FIG. 8.

According to the fifth embodiment, the contact diffusion layer 65 protrudes in an X direction and/or a Y direction from the end portion of the hole accumulation region 60 on the second surface F2 side toward the avalanche amplification region (30, 40). That is, in a plan view as viewed in a Z direction, the contact diffusion layer 65 is wider than the end surface of one end of the hole accumulation region 60 on the second surface F2 side. As indicated by a broken line in FIG. 9, the contact diffusion layer 65 protrudes from the hole accumulation region 60 toward the avalanche amplification region (30, 40), that is, toward the center of the pixel 1. Thus, the area of the second surface F2 covered with the anode (contact diffusion layer 65) increases, and the effects of surface pinning can be increased. Therefore, the influence of the charge accumulated on the insulation film 92 on the avalanche amplification region (30, 40) can be reduced.

The fifth embodiment may be combined with any of the second to fourth embodiments described above.

Sixth Embodiment

Figure 10:
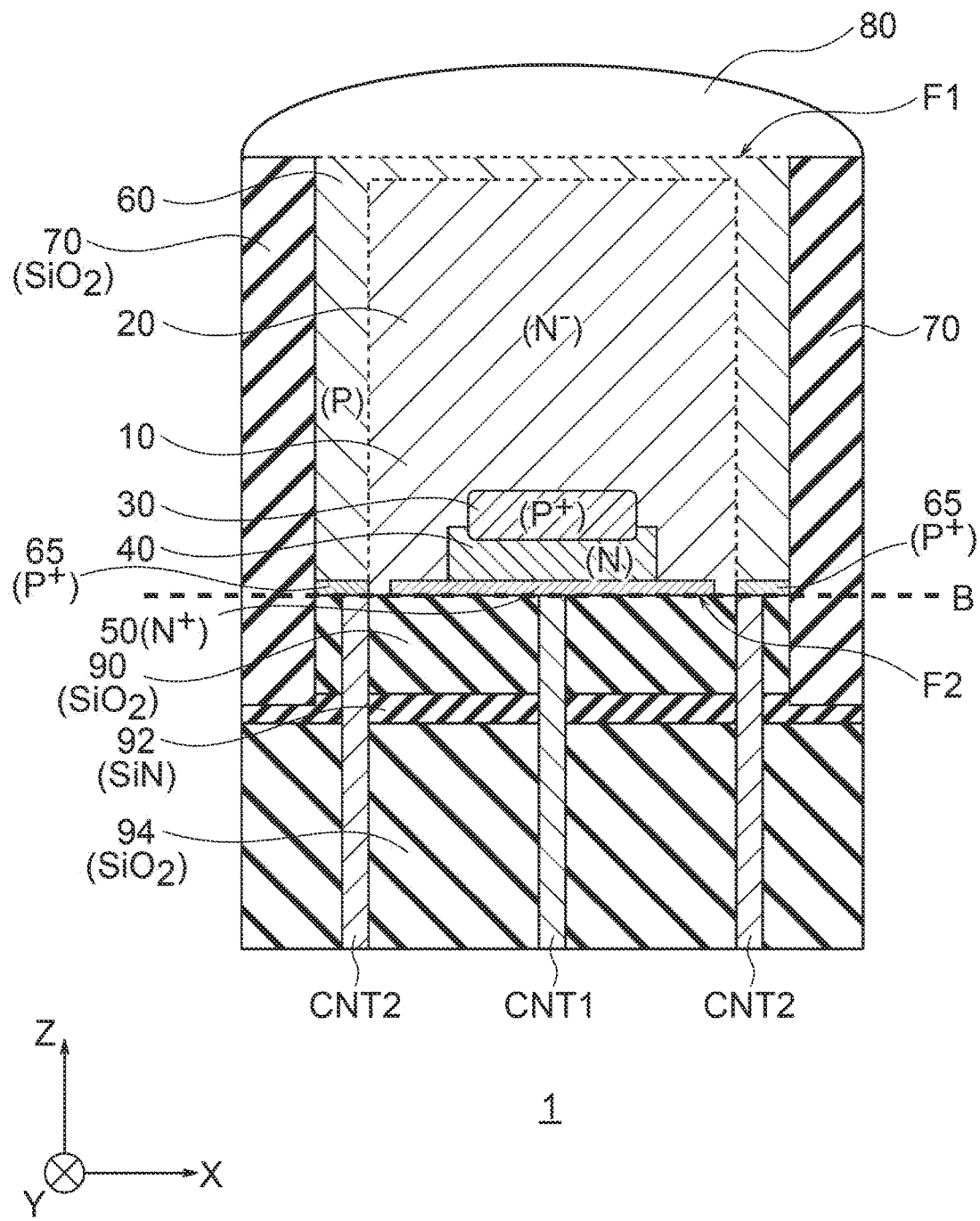
FIG. 10 is a cross-sectional view illustrating a configuration example of a pixel according to a sixth embodiment.
Figure 11:
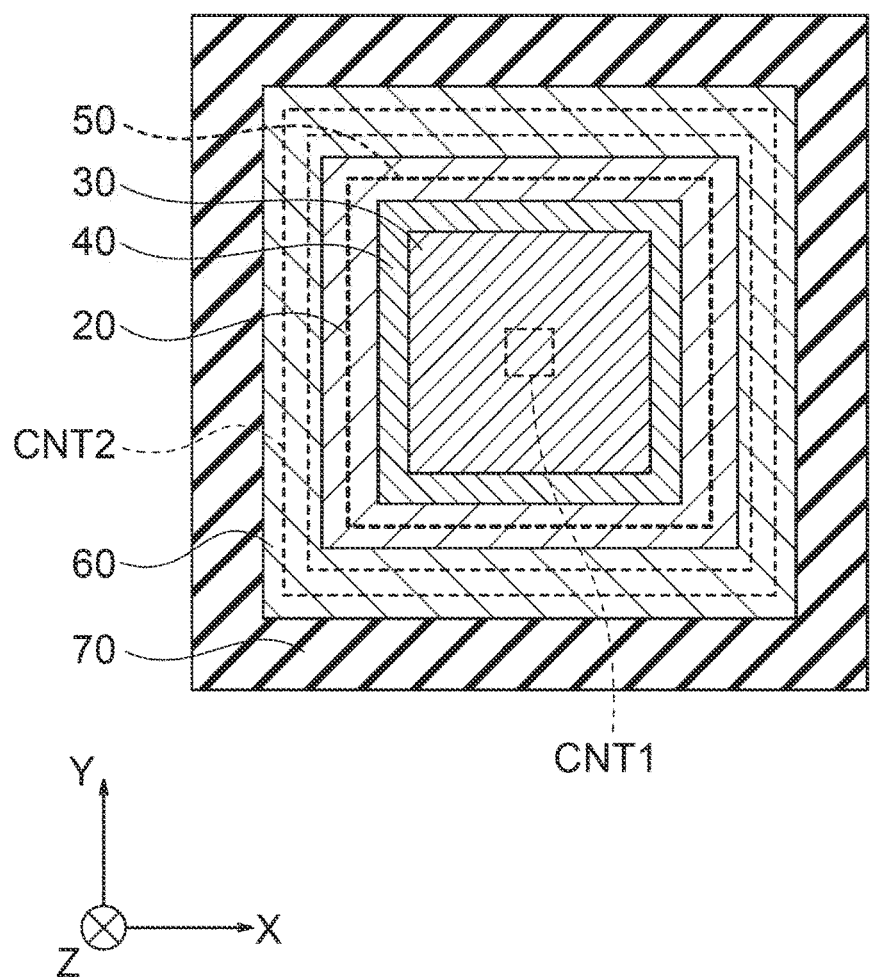
FIG. 11 is a schematic plan view illustrating a configuration example of a pixel according to the sixth embodiment.

FIG. 10 is a cross-sectional view illustrating a configuration example of a pixel 1 according to the sixth embodiment. FIG. 11 is a schematic plan view illustrating a configuration example of the pixel 1 according to the sixth embodiment. FIG. 11 illustrates a plane taken along line B-B in FIG. 10.

According to the sixth embodiment, the contact diffusion layer 50 protrudes in an X direction and/or a Y direction from the avalanche amplification region (30, 40) on the second surface F2 side toward the hole accumulation region 60 or the contact diffusion layer 65. That is, in a plan view as viewed in a Z direction, the contact diffusion layer 50 is wider than the avalanche amplification region (30, 40) on the second surface F2 side. As indicated by a broken line in FIG. 11, the contact diffusion layer 50 protrudes from the avalanche amplification region (30, 40) toward the hole accumulation region 60, that is, protrudes toward the outer edge of the pixel 1 further than the avalanche amplification region (30, 40). Thus, the area of the second surface F2 covered with the cathode (contact diffusion layer 50) increases, and the effects of surface pinning can be increased. Therefore, the influence of the charge accumulated on the insulation film 92 on the avalanche amplification region (30, 40) can be reduced.

The sixth embodiment may be combined with any of the second to fourth embodiments described above.

Seventh Embodiment

Figure 12:
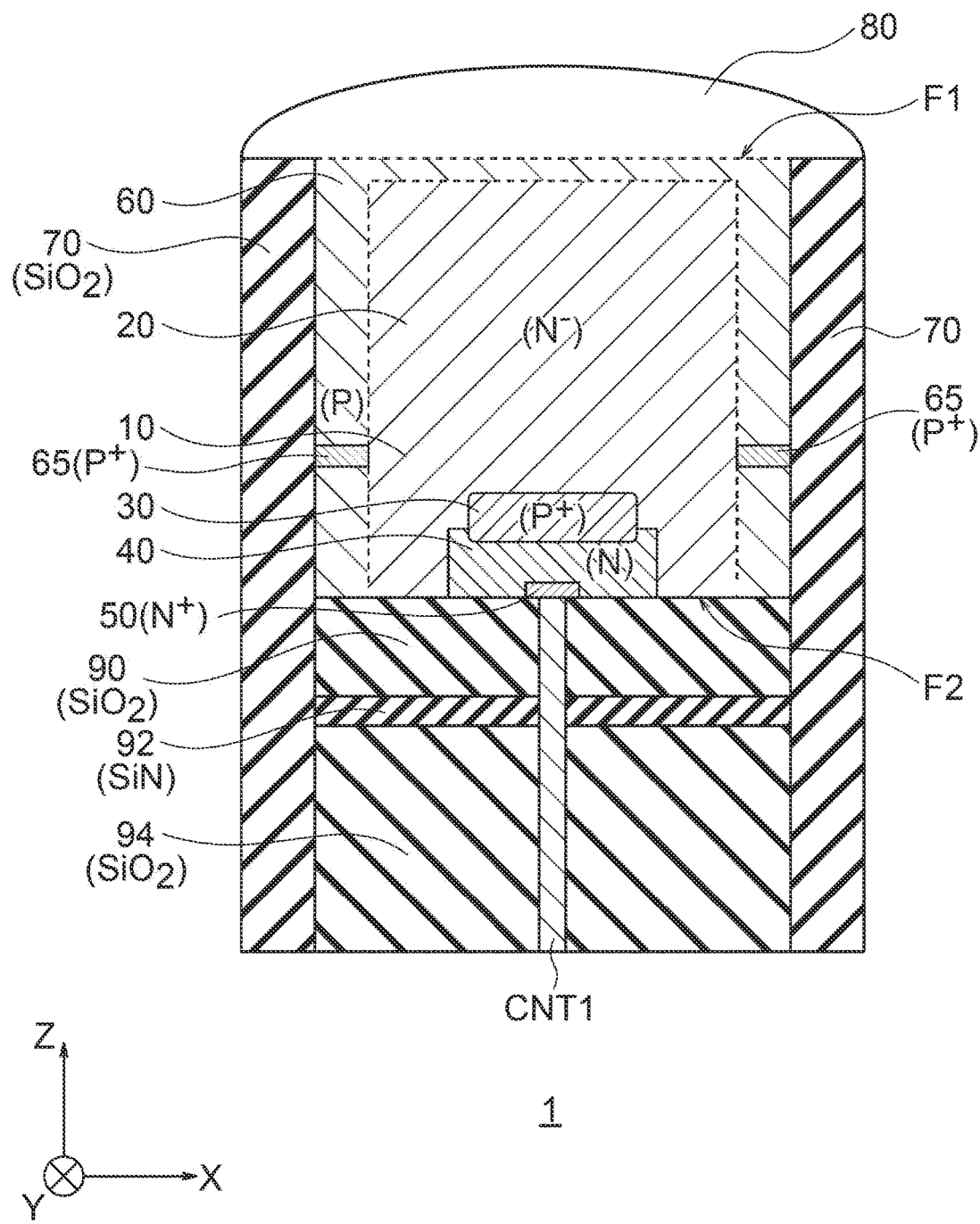
FIG. 12 is a cross-sectional view illustrating a configuration example of a pixel according to a seventh embodiment.

FIG. 12 is a cross-sectional view illustrating a configuration example of a pixel 1 according to the seventh embodiment. In the SPAD according to the seventh embodiment, the contact diffusion layer 65 of the hole accumulation region 60 is embedded in the substrate 10 as an embedded contact. The contact diffusion layer 65 is connected to a control circuit of another chip via a contact plug (not illustrated). Furthermore, the element isolation portion 70 is formed from the second surface F2 side after the insulation films 90, 92, and 94 are formed. Therefore, the element isolation portion 70 is provided from the bottom surface of the insulation film 94 to the first surface F1.

Also in the seventh embodiment, the film thickness of the insulation film 90 is larger than the film thickness of the insulation film 92. Accordingly, the charges generated in the avalanche amplification region (30, 40) and the well diffusion layer 20 are less likely to reach the insulation film 92, and less likely to be trapped on the insulation film 92. Furthermore, even when the charges are trapped on the insulation film 92, the electric field due to this is less likely to influence the avalanche amplification region (30, 40). As a result, it is possible to suppress the fluctuation of the drive start voltage (threshold voltage) in the pixel 1.

The other configurations of the seventh embodiment may be similar to the corresponding configurations of the first embodiment. Therefore, the SPAD according to the seventh embodiment can obtain the same effects as the SPAD according to the first embodiment. The SPAD according to the seventh embodiment may be combined with any of the second to sixth embodiments described above.

Eighth Embodiment

Figure 13:
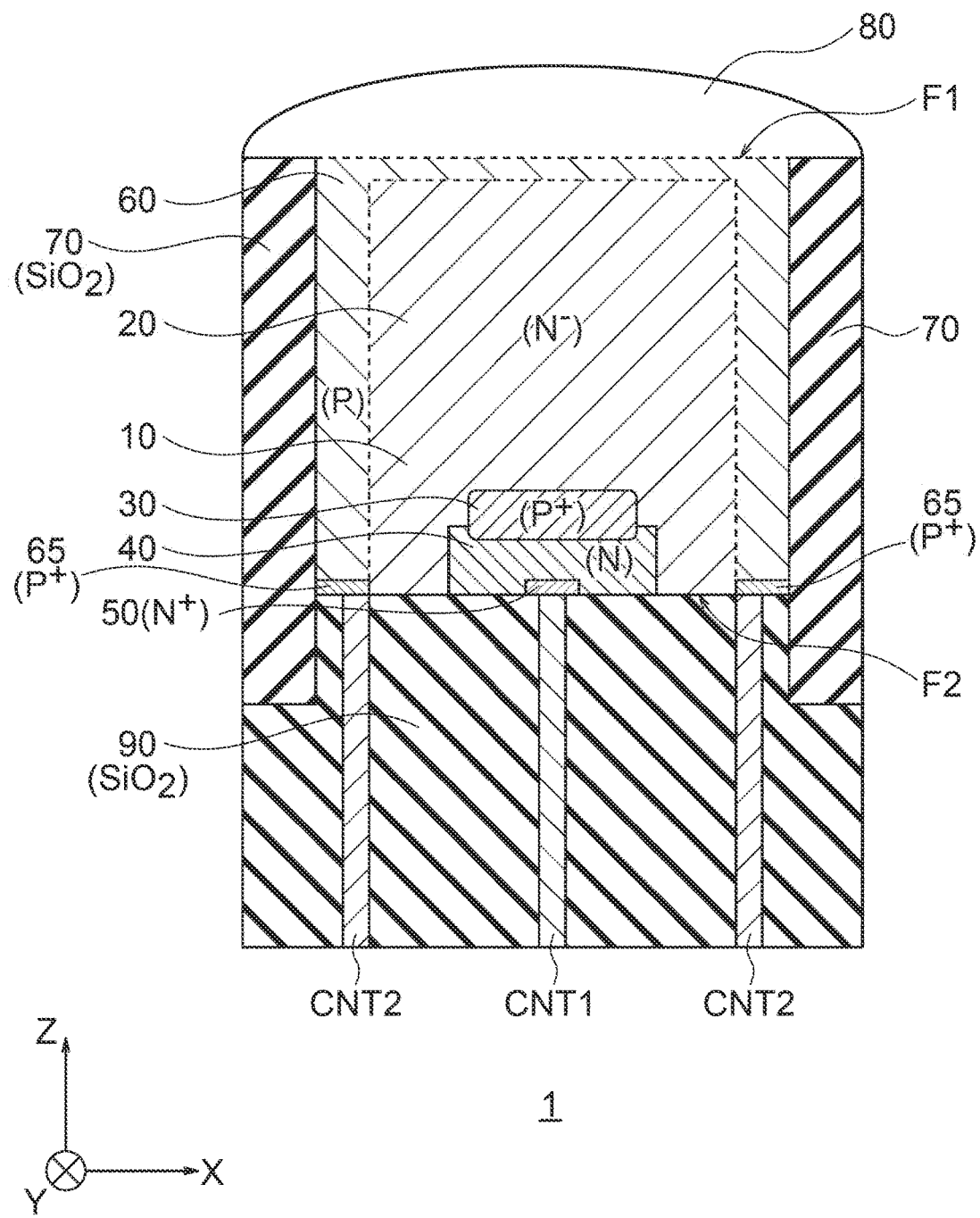
FIG. 13 is a cross-sectional view illustrating a configuration example of a pixel according to an eighth embodiment.

FIG. 13 is a cross-sectional view illustrating a configuration example of a pixel 1 according to the eighth embodiment. The SPAD according to the eighth embodiment is not provided with the insulation film 92. In this case, the insulation film 90 is in contact with the end portion of the element isolation portion 70 on the second surface F2 side. Note that the insulation films 90 and 94 include the same material (for example, a silicon oxide film). Therefore, the insulation films 90 and 94 are illustrated as the same insulation film 90.

Since the insulation film 92 is not provided, etching of the substrate 10 is controlled according to a time in a step of forming the element isolation portion 70. For example, since the silicon oxide film is used for the insulation film 90, the insulation film 90 is etched to some extent in the step of forming the element isolation portion 70, but there is no problem. The other configurations of the eighth embodiment may be similar to the corresponding configurations of the first embodiment.

In the eighth embodiment, since the insulation film 92 (for example, a silicon nitride film) that traps a charge is not provided, the fluctuation of the drive start voltage of the avalanche amplification region (30, 40) can be suppressed.

<Application to Imaging Device>

The pixel 1 according to the present disclosure can be applied to a device that measures a distance. Here, an example of the application of the SAPD will be described using a case where the pixel 1 is applied to a distance measurement device that measures a distance.

Figure 14:
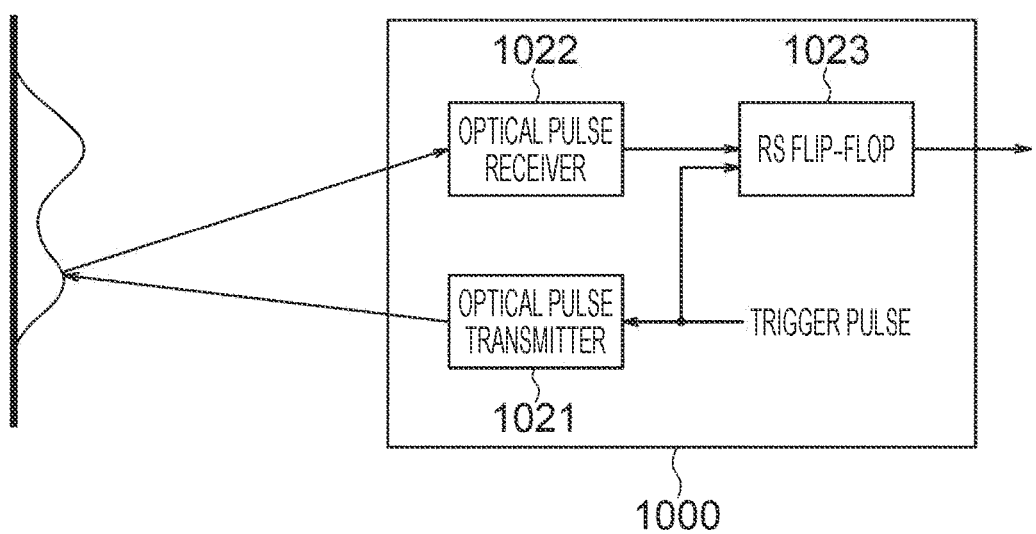
FIG. 14 is a diagram illustrating a configuration of an embodiment of a distance measurement device to which a SAPD according to the present technology is applied.

FIG. 14 is a diagram illustrating a configuration of an embodiment of the distance measurement device to which a SAPD 21 according to the present technology is applied. A distance measurement device 1000 illustrated in FIG. 14 includes an optical pulse transmitter 1021, an optical pulse receiver 1022, and an RS flip-flop 1023.

As a method of measuring the distance, a case where a time of flight (TOF) method is used will be described as an example. As a TOF-type sensor, the above-described APD 21 can be used.

The TOF-type sensor is a sensor that measures a distance to an object by measuring a time until light emitted by the TOF-type sensor hits the object and is reflected back. The TOF-type sensor operates, for example, at the timing illustrated in FIG. 15.

Figure 15:
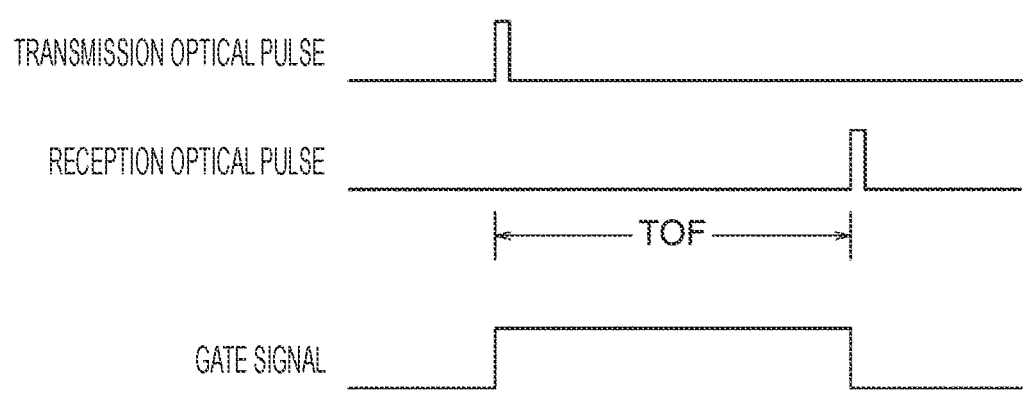
FIG. 15 is a diagram illustrating a configuration of an embodiment of a distance measurement device to which a SAPD according to the present technology is applied.

Operation of the distance measurement device 1000 will be described with reference to FIG. 15. The optical pulse transmitter 1021 emits light (optical transmission pulse) on the basis of a supplied trigger pulse. The emitted light hits the object, and the optical pulse receiver 1022 receives the reflected light. As the optical pulse receiver 1022, the above-described APD 21 can be used.

A difference between a time when the transmission optical pulse is emitted and a time when the reception optical pulse is received corresponds to a time corresponding to the distance to the object, that is, a light flight time TOF.

The trigger pulse is supplied to the optical pulse transmitter 1021 as well as the flip-flop 1023. The trigger pulse is supplied to the optical pulse transmitter 1021 to transmit a short-time optical pulse, and is supplied to the flip-flop 1023 to reset the flip-flop 1023.

In a case where the APD 21 is used as the optical pulse receiver 1022, when a reception optical pulse is received by the APD 21, photons are generated. The flip-flop 1023 is reset by the generated photons (electric pulses).

With such an operation, a gate signal having a pulse width corresponding to the light flight time TOF can be generated. The TOF can be calculated (output as a digital signal) by counting the generated gate signal by using a clock signal or the like.

In the distance measurement device 1000, distance information is generated by the processing as described above. The above-described APD 21 can be used for the distance measurement device 1000.

<Application Example to Mobile Body>

The technology according to the present disclosure (the present technology) can be applied to various products. For example, the technology according to the present disclosure may also be realized as a device mounted on any type of mobile body such as an automobile, an electric vehicle, a hybrid electric vehicle, a motorcycle, a bicycle, a personal mobility, an airplane, a drone, a ship, and a robot.

Figure 16:
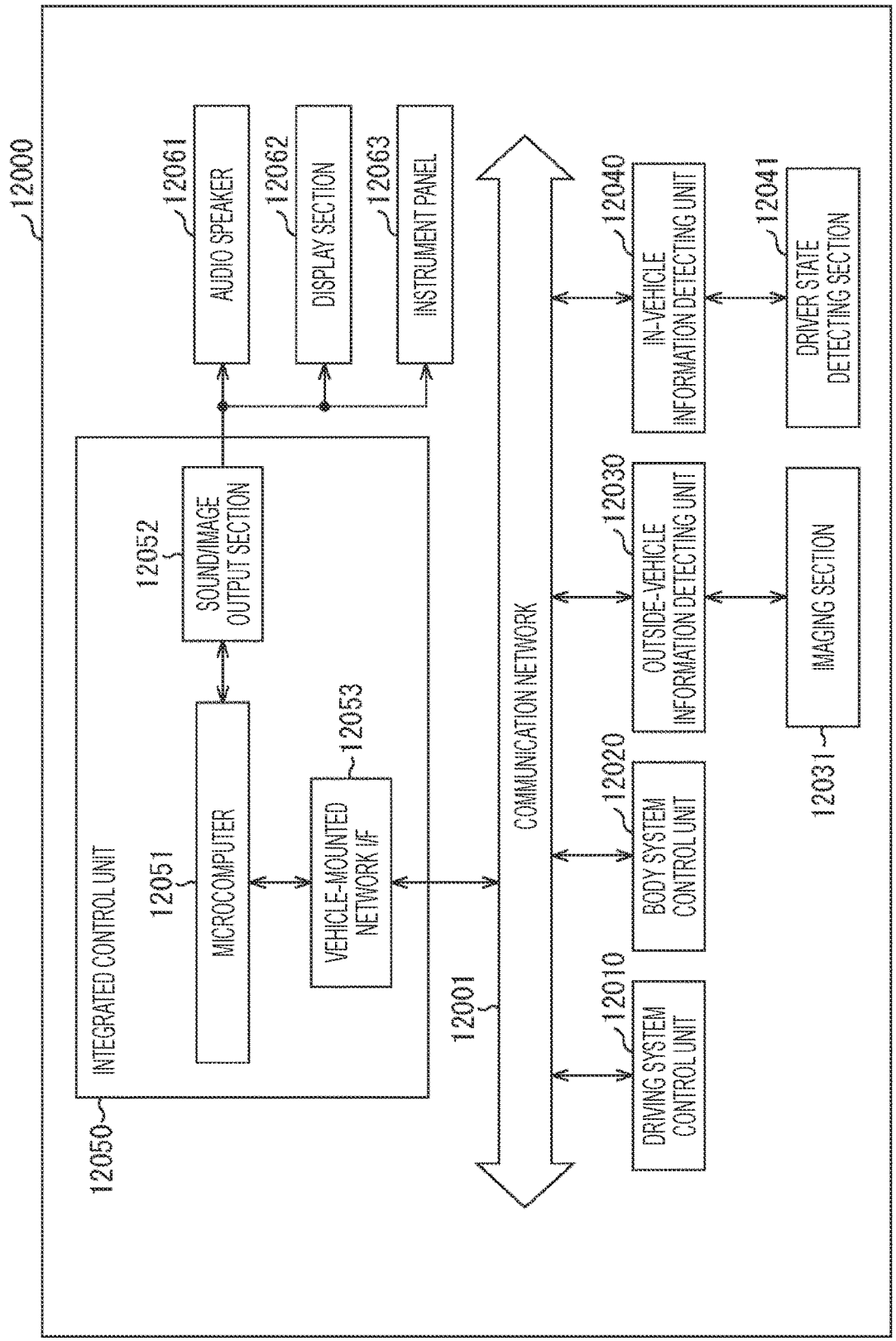
FIG. 16 is a block diagram illustrating a schematic configuration example of a vehicle control system as an example of a moving body control system to which the technology according to the present disclosure can be applied.

FIG. 16 is a block diagram illustrating a schematic configuration example of a vehicle control system as an example of a moving body control system to which the technology according to the present disclosure can be applied.

The vehicle control system 12000 includes a plurality of electronic control units connected to each other via a communication network 12001. In the example illustrated in FIG. 66, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010.

For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 66, an audio speaker 12061, a display section 12062, and an instrument panel 12063 are illustrated as the output device. The display section 12062 may, for example, include at least one of an on-board display and a head-up display.

Figure 17:
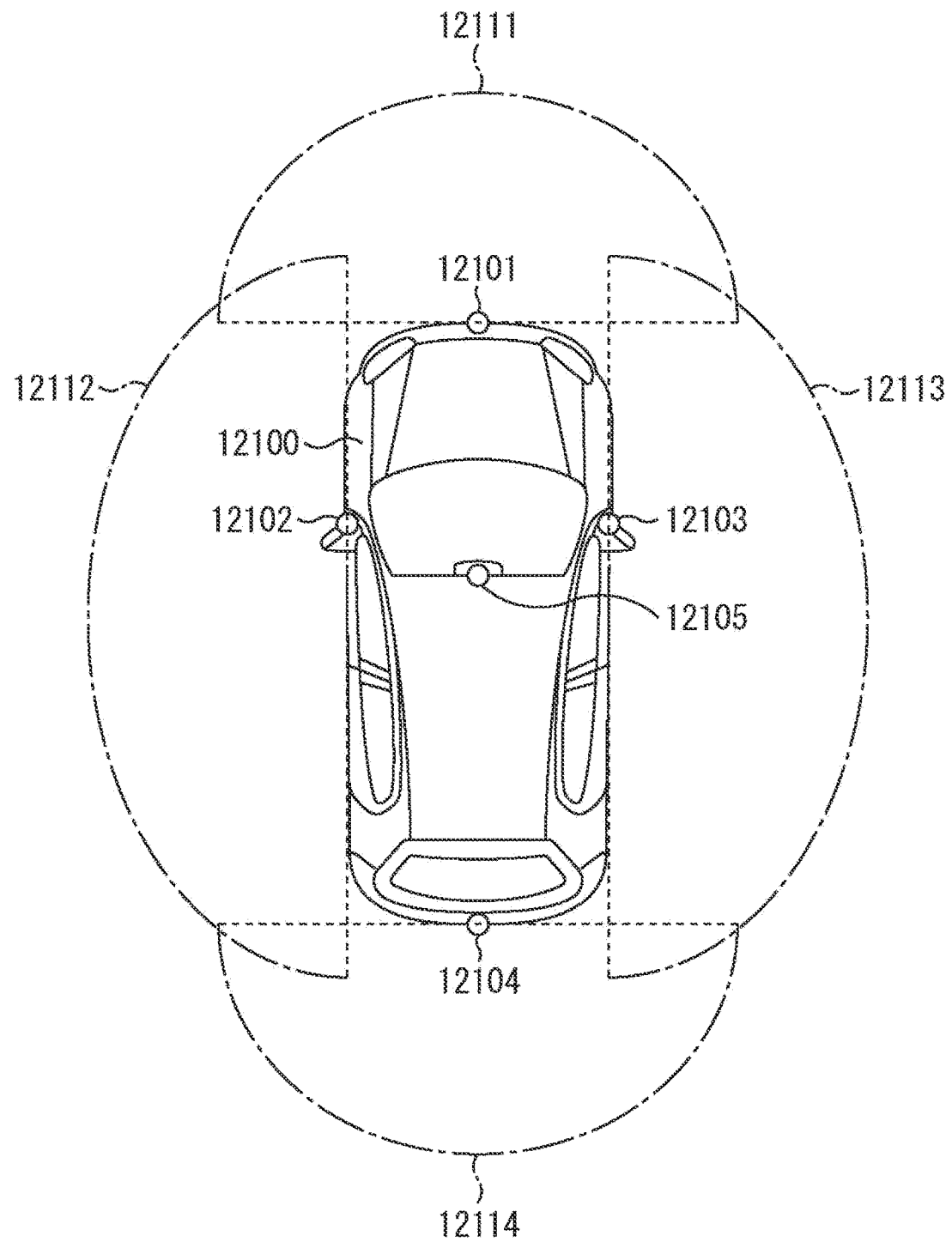
FIG. 17 is a diagram illustrating an example of an installation position of an imaging section.

FIG. 17 is a diagram illustrating an example of an installation position of the imaging section 12031.

In FIG. 17, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 17 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Note that the effects described in the present description are merely examples and are not limited, and other effects may be provided.

Note that embodiments of the present technology are not limited to the embodiments described above, and various modifications can be made without departing from the gist of the present technology.

Note that the present technology can also have the following configurations.

(1)

An optical detection device including:
  a semiconductor substrate that has a first surface as a light incident surface and a second surface on an opposite side to the light incident surface;
  a first pixel that is in the semiconductor substrate and has an avalanche amplification region including a first conductive region and a second conductive region;
  a pixel isolation portion that isolates the first pixel from an adjacent pixel;
  a first insulation film that is provided on the second surface side and in contact with the pixel isolation portion; and
  a second insulation film that is provided between the first insulation film and the avalanche amplification region, in which a film thickness of the second insulation film is larger than the film thickness of the first insulation film.

(2)

The optical detection device according to (1), in which the first insulation film is a silicon nitride film, and
  the second insulation film is a silicon oxide film.

(3)

The optical detection device according to (1) or (2), in which the first insulation film has a thickness of less than 15 nm, and
  the second insulation film has the thickness of 40 nm or less.

(4)

The optical detection device according to any one of (1) to (3), in which the first insulation film is in contact with an end portion of the pixel isolation portion on the second surface side.

(5)

The optical detection device according to any one of (1) to (4), further including a third insulation film that is provided between the first insulation film and the second insulation film and has a higher surface density as compared with the first and second insulation films.

(6)

The optical detection device according to (5), in which the third insulation film includes aluminum oxide.

(7)

The optical detection device according to any one of (1) to (6), in which the first insulation film is provided below the avalanche amplification region.

(8)

The optical detection device according to any one of (1) to (7), in which the first insulation film is provided only immediately below an end portion of the pixel isolation portion on the second surface side.

(9)

The optical detection device according to any one of (1) to (8), further including a first contact plug that penetrates the first and second insulation films and is electrically connected to one end of the avalanche amplification region.

(10)

The optical detection device according to (9), further including:
  a charge accumulation region that is provided around the avalanche amplification region; and
  a second contact plug that penetrates the first and second insulation films and is electrically connected to one end of the charge accumulation region.

(11)

The optical detection device according to (10), in which one of the first and second contact plugs functions as a cathode and the other one functions as an anode.

(12)

The optical detection device according to (10) or (11), further including:

a first contact diffusion layer that electrically connects the first contact plug to one end of the avalanche amplification region; and
a second contact diffusion layer that electrically connects the second contact plug to one end of the charge accumulation region,
in which the first contact diffusion layer is wider than the avalanche amplification region in a plan view as viewed in a direction substantially perpendicular to the first surface.

(13)
The optical detection device according to (10) or (11), further including:
a first contact diffusion layer that electrically connects the first contact plug to one end of the avalanche amplification region; and
a second contact diffusion layer that electrically connects the second contact plug to one end of the charge accumulation region,
in which the second contact diffusion layer is wider than an end surface of one end of the charge accumulation region in a plan view as viewed in a direction substantially perpendicular to the first surface.

(14)
An optical detection device including:
a semiconductor substrate that has a first surface as a light incident surface and a second surface on an opposite side to the light incident surface;
a first pixel that is in the semiconductor substrate and has an avalanche amplification region including a first conductive region and a second conductive region;
a pixel isolation portion that isolates the first pixel from an adjacent pixel; and
a silicon oxide film that is in contact with an end portion of the pixel isolation portion on the second surface side.

(15)
The optical detection device according to (14), further including a first contact plug that penetrates the silicon oxide film and is electrically connected to one end of the avalanche amplification region.

(16)
The optical detection device according to (15), further including:
a charge accumulation region that is provided around the avalanche amplification region; and
a second contact plug that penetrates the silicon oxide film and is electrically connected to one end of the charge accumulation region.

(17)
The optical detection device according to (16), in which one of the first and second contact plugs functions as a cathode and the other one functions as an anode.

Note that the present disclosure is not limited to the above-described embodiments, and various modifications can be made without departing from the gist of the present disclosure. Furthermore, the effects described in the present description are merely examples and are not limited, and other effects may be provided.

REFERENCE SIGNS LIST

1 Pixel
10 Substrate
20 Well diffusion layer
30, 40 Impurity diffusion layer
50, 65 Contact diffusion layer
60 Hole accumulation region
70 Element isolation portion
80 On-chip lens
90, 92, 94 Insulation film
CNT1, CNT2 Contact plug

The invention claimed is:

1. An optical detection device comprising:
a semiconductor substrate that has a first surface as a light incident surface and a second surface on an opposite side to the light incident surface;
a first pixel that is in the semiconductor substrate and has an avalanche amplification region including a first conductive region and a second conductive region;
a pixel isolation portion that isolates the first pixel from an adjacent pixel;
a first insulation film that is provided on the second surface side and in contact with the pixel isolation portion; and
a second insulation film that is provided between the first insulation film and the avalanche amplification region,
wherein a film thickness of the second insulation film is larger than the film thickness of the first insulation film.

2. The optical detection device according to claim 1, wherein the first insulation film is a silicon nitride film, and the second insulation film is a silicon oxide film.

3. The optical detection device according to claim 1, wherein the first insulation film has a thickness of less than 15 nm, and the second insulation film has the thickness of 40 nm or less.

4. The optical detection device according to claim 1, wherein the first insulation film is in contact with an end portion of the pixel isolation portion on the second surface side.

5. The optical detection device according to claim 1, further comprising a third insulation film that is provided between the first insulation film and the second insulation film and has a higher surface density as compared with the first and second insulation films.

6. The optical detection device according to claim 5, wherein the third insulation film includes aluminum oxide.

7. The optical detection device according to claim 1, wherein the first insulation film is provided below the avalanche amplification region.

8. The optical detection device according to claim 1, wherein the first insulation film is provided only immediately below an end portion of the pixel isolation portion on the second surface side.

9. The optical detection device according to claim 1, further comprising a first contact plug that penetrates the first and second insulation films and is electrically connected to one end of the avalanche amplification region.

10. The optical detection device according to claim 9, further comprising:
a charge accumulation region that is provided around the avalanche amplification region; and
a second contact plug that penetrates the first and second insulation films and is electrically connected to one end of the charge accumulation region.

11. The optical detection device according to claim 10, wherein one of the first contact plug or the second contact plugs functions as a cathode and another of the first contact plug or the second contact plug functions as an anode.

12. The optical detection device according to claim 10, further comprising:
a first contact diffusion layer that electrically connects the first contact plug to one end of the avalanche amplification region; and a second contact diffusion layer that electrically connects the second contact plug to one end of the charge accumulation region, wherein the first contact diffusion layer is wider than the avalanche amplification region in a plan view as viewed in a direction substantially perpendicular to the first surface.

13. The optical detection device according to claim 10, further comprising:

a first contact diffusion layer that electrically connects the first contact plug to one end of the avalanche amplification region; and a second contact diffusion layer that electrically connects the second contact plug to one end of the charge accumulation region, wherein the second contact diffusion layer is wider than an end surface of one end of the charge accumulation region in a plan view as viewed in a direction substantially perpendicular to the first surface.

* * * * *